(12) United States Patent
Aleksov et al.

(10) Patent No.: US 12,520,506 B2
(45) Date of Patent: Jan. 6, 2026

(54) IN SITU INDUCTOR STRUCTURE IN BUILDUP POWER PLANES

(71) Applicant: Intel Corporation, Santa Clara, CA (US)

(72) Inventors: Aleksandar Aleksov, Chandler, AZ (US); Adel Elsherbini, Chandler, AZ (US); Johanna Swan, Scottsdale, AZ (US); Feras Eid, Chandler, AZ (US); Thomas L. Sounart, Chandler, AZ (US); Henning Braunisch, Phoenix, AZ (US); Beomseok Choi, Chandler, AZ (US); Krishna Bharath, Phoenix, AZ (US); Kaladhar Radhakrishnan, Chandler, AZ (US); William J. Lambert, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 957 days.

(21) Appl. No.: 17/485,243

(22) Filed: Sep. 24, 2021

(65) Prior Publication Data
US 2023/0096368 A1 Mar. 30, 2023

(51) Int. Cl.
*H01L 49/02* (2006.01)
*H01F 27/255* (2006.01)
(Continued)

(52) U.S. Cl.
CPC .............. *H10D 1/20* (2025.01); *H01F 27/255* (2013.01); *H01F 27/2804* (2013.01);
(Continued)

(58) Field of Classification Search
CPC ..... H10D 1/20; H01F 27/255; H01F 27/2804; H01F 41/0206; H01F 41/041;
(Continued)

(56) References Cited

U.S. PATENT DOCUMENTS

| 9,129,817 B2 * | 9/2015 | Elsherbini | .............. H10D 86/85 |
| 2010/0052992 A1 * | 3/2010 | Okamura | .............. H01Q 19/108 |
| | | | 343/700 MS |

(Continued)

FOREIGN PATENT DOCUMENTS

| CN | 102783248 B | * | 10/2014 | .............. C21D 1/42 |
| CN | 109792839 B | * | 6/2022 | .............. B60R 16/03 |
| KR | 20050085864 A | * | 8/2025 | |
| WO | WO-2023203176 A2 | * | 10/2023 | ........... H02N 11/008 |

*Primary Examiner* — Jarrett J Stark
(74) *Attorney, Agent, or Firm* — Alliance IP, LLC

(57) ABSTRACT

An inductor structure, a package substrate, an integrated circuit device, an integrated circuit device assembly and a method of fabricating the inductor structure. The inductor structure includes: an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

21 Claims, 10 Drawing Sheets

(51) Int. Cl.
*H01F 27/28* (2006.01)
*H01F 41/02* (2006.01)
*H01F 41/04* (2006.01)
*H01L 21/48* (2006.01)
*H01L 23/498* (2006.01)
*H01L 23/64* (2006.01)
*H10D 1/20* (2025.01)

(52) U.S. Cl.
CPC ....... *H01F 41/0206* (2013.01); *H01F 41/041* (2013.01); *H01L 21/4857* (2013.01); *H01L 23/49822* (2013.01); *H01L 23/49838* (2013.01); *H01L 23/49866* (2013.01); *H01L 23/645* (2013.01)

(58) Field of Classification Search
CPC ........... H01F 17/0006; H01F 2017/065; H01F 17/0033; H01F 41/046; H01L 21/4857; H01L 23/49822; H01L 23/645
See application file for complete search history.

(56) References Cited

U.S. PATENT DOCUMENTS

| | | | |
|---|---|---|---|
| 2012/0312805 A1* | 12/2012 | Umetsu | C21D 9/56 219/645 |
| 2018/0096764 A1* | 4/2018 | Gardner | H01F 1/14733 |
| 2019/0013129 A1* | 1/2019 | Maede | H01F 3/08 |
| 2019/0115308 A1* | 4/2019 | Dayringer | H01L 23/66 |
| 2020/0037431 A1* | 1/2020 | Jaster | B60R 16/03 |
| 2020/0312796 A1* | 10/2020 | Braunisch | H01L 23/42 |
| 2023/0095608 A1* | 3/2023 | Elsherbini | H10D 84/01 29/825 |
| 2023/0098303 A1* | 3/2023 | Tomita | H01L 24/16 257/751 |
| 2023/0098957 A1* | 3/2023 | Eid | H01L 25/0652 257/691 |
| 2023/0099827 A1* | 3/2023 | Elsherbini | B33Y 80/00 257/751 |

* cited by examiner

IN SITU INDUCTOR STRUCTURE IN BUILDUP POWER PLANES

BACKGROUND

Inductor structures may be placed, similar to capacitors, at the land side or die side of a package substrate as discrete components. In addition, package-substrate core based magnetic inductors have also been provided which use magnetic plated through holes.

Magnetic inductors provided by way of plated through holes are however only available for server packages where the package core is thick enough to provide the necessary inductance given by the length of the through hole. In such a plated through hole architecture, only relatively low $\mu_r$ magnetic materials can be used for the inductors, as a magnetic paste must be used to plug the PTHs, the magnetic paste consisting of a non-magnetic ($\mu_r$=1) matrix surrounding high $\mu_r$ particles.

Land side and die side magnetic inductors take up space on the package, which may require growing the package size, and thus potentially encroaching on ball grid arrays or land grid arrays. Additional inductor losses may further occur as a result of the distance of such inductors to the die.

DETAILED DESCRIPTION

Figure 1:
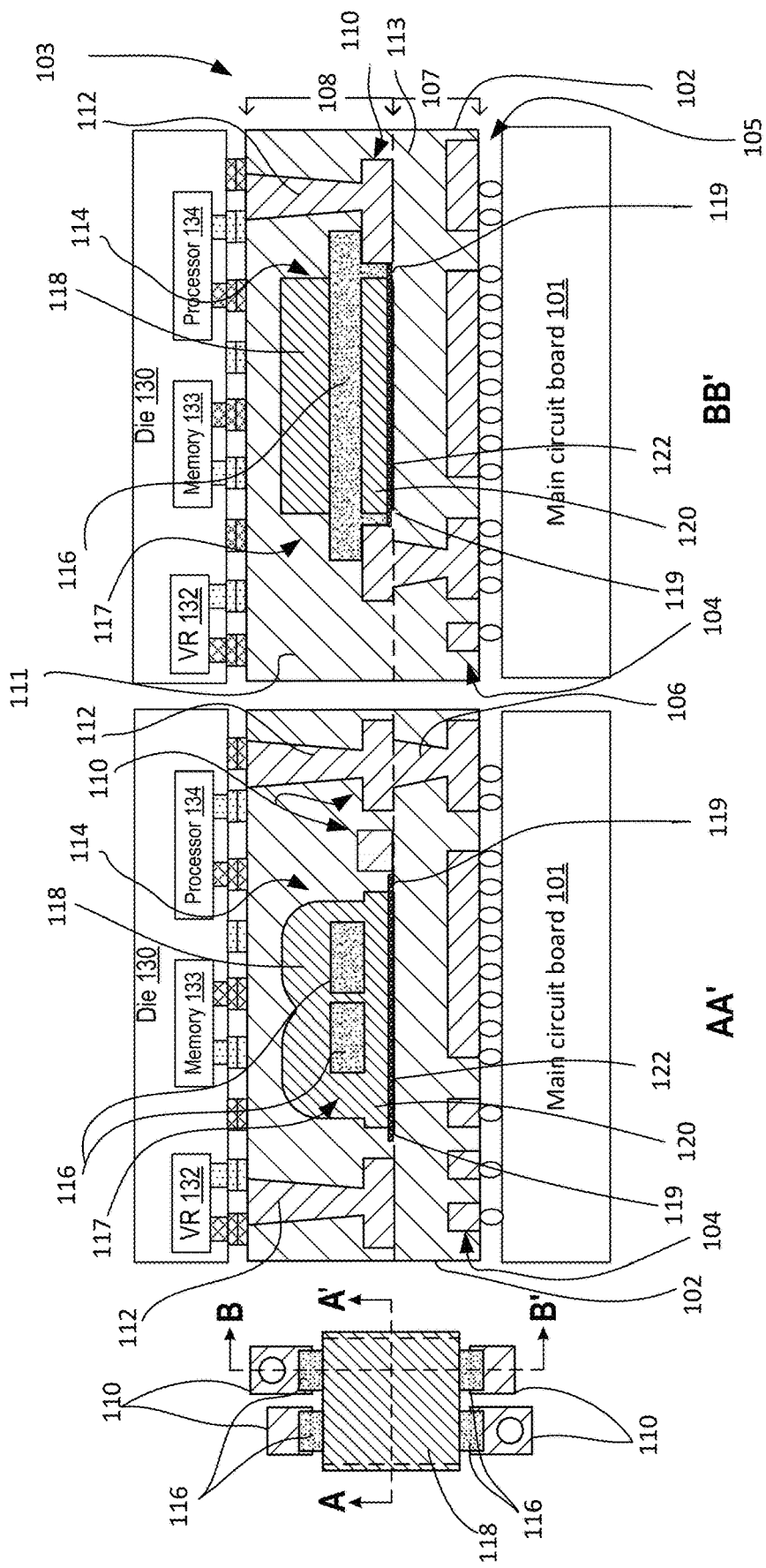
FIG. 1 illustrates an inductor architecture in which the magnetic material of the magnetic structure conformally wraps around two electrically conductive structures embedded therein, according to a first embodiment.

Some embodiments address the creation of package buildup layer magnetic inductors that are in-situ manufactured during the standard package manufacturing process with the addition of cold-spray in order to enable the provision of high $\mu_r$ magnetic materials and hence high inductance density and quality factor inductors in microelectronic structures, such as integrated circuit assemblies. According to some embodiments, cold spray can also be used for some or all electrically conductive structures (such as Cu) of the inductor to further increase performance and decrease inductor losses.

Cold spray for manufacturing magnetic inductors allows these inductors to be manufactured within the package buildup layers hence allowing for high inductance at a minimum of inductor size. As they can be manufactured on any buildup layer, they are not limited only for server products, but can be implemented for all products.

According to some embodiments, buildup layer embedded inductor structures can be manufactured using magnetic materials that are otherwise incompatible with standard packaging manufacturing processes, such as plating. Thus, embodiments advantageously offer higher inductance densities and quality factors.

Embedded inductor structures manufactured using cold spray can be detected due to the unique architecture and connected to the power delivery network. The unique grain structure of the material due to cold spray further serves to identify the process used. Embedded inductors manufactured by cold spray can be identified by the materials used and the structure of the materials themselves.

Aspects of the present disclosure may include an inductor structure embedded in a microelectronic device where at least portions of the inductor structure are provided using cold spray. The inductor structure may include an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

As used herein, the "backside of a die" may refer to the side or surface of a die that is opposite of, or intended to be positioned opposite of, a package substrate.

A "die" as referred to herein may include circuitry such as for example, voltage regulator circuitry, memory circuitry, and/or logic circuitry, e.g., a field programmable gate array (FPGA), application-specific integrated circuit (ASIC), central processor unit (CPU) circuitry, graphics processing unit (GPU) circuitry, or other types of digital logic circuitry. A "die" as referred to herein may be implemented as a die stack in some embodiments, or may be implemented as several different dies on an organic or inorganic interposer apparatus.

The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. The drawings are not to scale.

Figure 2:
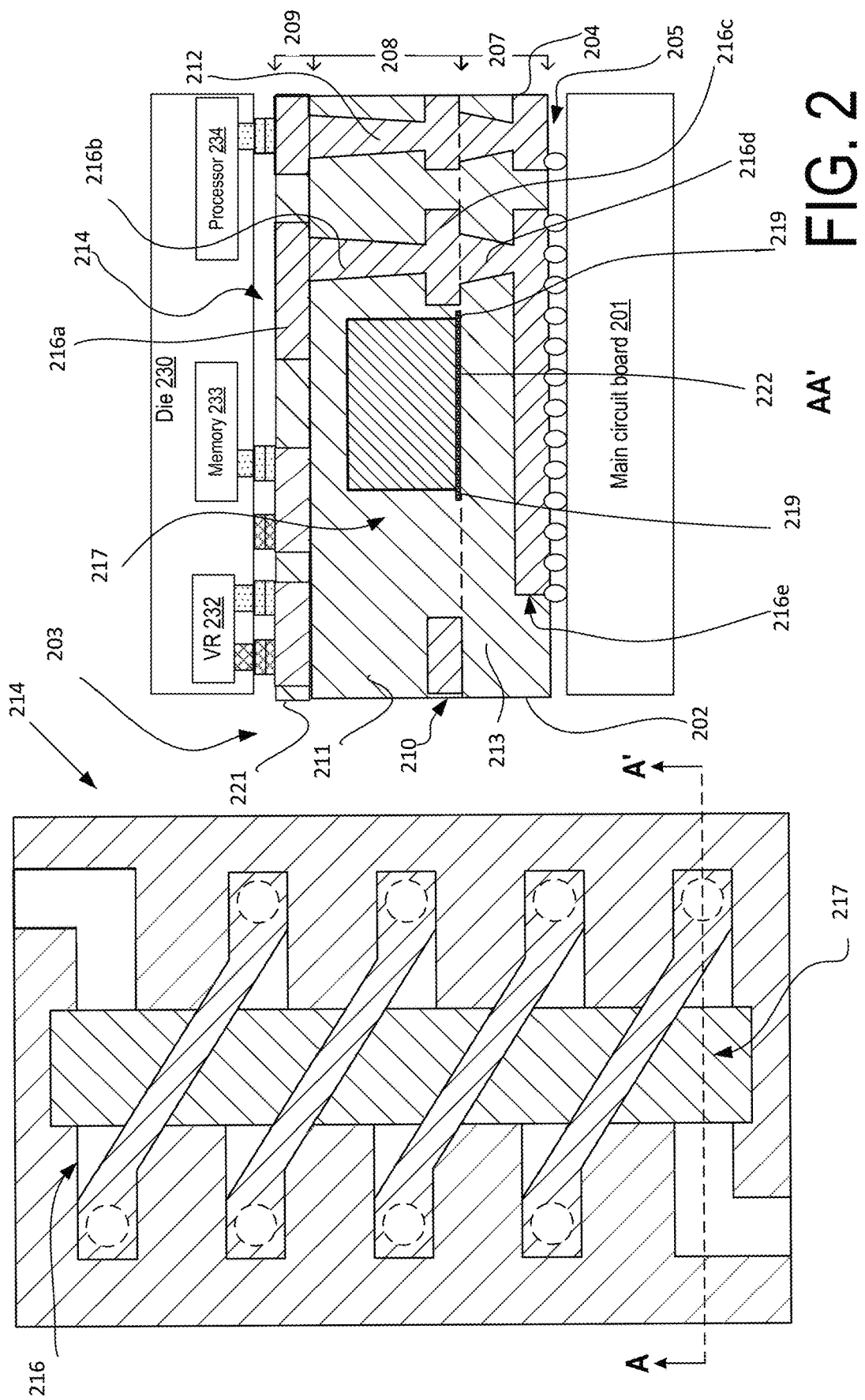
FIG. 2 illustrates a magnetic core inductor architecture where the electrically conductive structures wrap/spiral around a magnetic structure, where the magnetic structure is a magnetic core including a magnetic material.

Two possible embodiments of a package buildup-layer manufactured magnetic inductor structure using cold spray in the manufacturing process are illustrated in FIGS. 1 and 2. FIG. 1 illustrates an inductor architecture in which the magnetic material of the magnetic structure conformally wraps around two electrically conductive structures embedded therein, where the electrically conductive structures are lines or traces including an electrically conductive material such as a metal, whereas FIG. 2 illustrates a magnetic core inductor architecture where the electrically conductive structures wrap/spiral around a magnetic structure, where the magnetic structure is a magnetic core including a magnetic material. These figures will be described in further detail below. The electrically conductive structures of FIG. 1 or FIG. 2 together form an electrically conductive body of the inductor structure shown in each figure.

FIG. 1 illustrates an example integrated circuit structure 100 that includes a first configuration of an inductor structure 114 in accordance with a first embodiment of the present disclosure. In FIG. 1, a package substrate 103 is shown as having been electrically and mechanically coupled to a main circuit board 101 by way of coupling components 105, which may include solder balls as shown, or pins (e.g., as part of a pin grid array (PGA), contacts (e.g., as part of a land grid array (LGA)), male and female portions of a socket, an adhesive, an underfill material, and/or any other suitable electrical and/or mechanical coupling structure. Inductor structure 114 is shown as having been provided inside the package substrate 103, and specifically inside a buildup layer 108 above buildup layer 107 of substrate 103. Buildup layer 107 includes a power plane 104, while buildup layer 108 includes a power plane 110 as shown. A dielectric layer 102 encapsulates the power plane 104 and power plane 110, through vias 106 and 112, and the inductor structure 114. Dielectric layer 102 may include the dielectric layers of all buildup layers, including dielectric layer 113 of buildup layer 107, and dielectric layer 111 of buildup layer 108 as shown. Dielectric layer 102 may include an organic dielectric material, such as Ajinomoto Build-up Film (ABF) to name one example, although any number of dielectric fill materials can be used, as will be appreciated.

A "package substrate" as used herein may refer to a circuit board such as circuit board 802 of FIG. 8 described below, including a plurality of buildup layers, and a plurality of conductive structures including interconnect lines or traces encapsulated within one or more dielectric materials. Although example embodiments described herein are in the context of an inductor structure within a package substrate, embodiments are not so limited, and include within their scope the provision of an inductor structure as described herein in any part of an integrated circuit device assembly, including within an integrated circuit component including one or more dies.

The power planes may include electrically conductive layers. Inductor structure 114 as shown includes a configuration where the magnetic structure 117 wraps around 2 conductor lines or traces 116 (electrically conductive structures 116).

A "electrically conductive structure" as used herein refers to a microelectronic structure that is electrically conductive.

The magnetic structure 117 has a bottom portion 120, and a top portion 118 as shown. The magnetic bottom portion may be adjacent a buffer layer 122 that extends under the inductor structure 114 and has extension regions 119 that extend beyond a footprint of the same. The buffer layer 122 may be disposed between and adjacent to both buildup layers 107 and 108 as shown. Alternatively, there may be intervening layers between buffer layer 122 and one or both of buildup layers 107 and 108.

FIG. 2 illustrates an example integrated circuit structure 200 that includes a first configuration of an inductor structure 214 in accordance with a second embodiment of the present disclosure. As noted previously, the inductor structure 214 of FIG. 2 presents a coiled configuration, where a electrically conductive structure 216 coils around magnetic structure 217. In FIG. 2, a package substrate 203 is shown as having been electrically and mechanically coupled to a main circuit board 201 by way of coupling components 205 similar to coupling components 105. Inductor structure 214 is shown as having been provided inside the package substrate 203, and specifically inside a buildup layer 208 and buildup layer 209 above buildup layer 207 of substrate 203. Buildup layer 207 includes a power plane 204 which includes inductor coil power plane 216e. Buildup layer 208 includes a power plane 210 as shown, which includes inductor coil power plane 216c. Build up layer 209 includes a power plane 215 as shown, which includes inductor coil power plane 216a. The inductive coil electrically conductive structure 216 includes power planes 216a, 216c, 216e, and, in addition, vias 216b and 216d as shown. A dielectric layer 202 encapsulates the power plane 204 and power plane 210, through vias 206, 212, 216b and 216d, and the magnetic structure 217. Buildup layer 207 includes a dielectric layer 213, buildup layer 108 includes a dielectric layer 211, and buildup layer 209 includes a dielectric layer 221 as shown. The power planes may include electrically conductive layers. Inductor structure 214 as shown includes a configuration where the conductive structure 216 coils around magnetic structure 217. The magnetic structure 217 may be adjacent a buffer layer 222 at a bottom surface thereof, the buffer layer extending under the magnetic structure 217 and having extension regions 219 that extend beyond a footprint of the same. The buffer layer 222 may be disposed between and adjacent to both buildup layers 207 and 208 as shown. Alternatively, there may be intervening layers between buffer layer 222 and one or both of buildup layers 207 and 208.

The dielectric layer 102/202 may be formed using an organic dielectric material, such as, for example, silica filled epoxy or inorganic dielectric such as $Si_3N_4$, $TiO_2$, $HfO_2$, SiCN, $SiO_2$, AlN, $Al_2O_3$ or other similar materials or combinations of different layers (e.g., as a barrier or improved capacitor electrodes).

Power planes 104/204 and 110/210, along with vias 106/206 and 112/212, together form a power structure that allows for power delivery to component circuitry of a die 130/230, which may include one or more of voltage regulator circuitry 132/232, memory circuitry 133/233, and/or processor circuitry 134/234. In some instances, the die 130/230 may include only one type of circuitry thereon. In other instances, each of the different circuitries may be housed in a separate die instead of one die as shown. In some embodiments, the die 130/230 may be implemented as a die stack, or may be implemented as several different dies on an organic or inorganic interposer apparatus (e.g., with each die comprising different circuitry).

Although described herein as being power "planes", it will be understood that the power planes of the present disclosure may not be planar in the geometric sense (e.g., completely flat in one plane like traditional power planes). In addition, although shown as formed in a particular way (e.g., with two power planes), the power structure may be formed in any suitable manner in accordance with the examples described herein (e.g., with three or more power planes, or with different via shapes, or no vias). Further, although shown as being located in a package substrate 103/203, the inductor structure 114/214 may be included in any suitable location within a microelectronic package. As one example, the inductor structure 114/214 may be used on the backside of a die, or as part of a die stack. The power planes may also be used to deliver power from one die to another die on the same package (e.g., from a separate voltage regulator die to a processor die) or from outside the package (main board, battery, etc.) to the package and then to the die(s).

Referring to the inductor structure 114, components of the same, such as electrically conductive structures 116 and magnetic structure 117, may be, at least in part, provided by way of a cold spray process. Referring to the inductor structure 214, components of the same, such as magnetic structure 217, may be, at least in part, provided by way of a cold spray process.

Cold spraying (CS) is a coating deposition method, where solid powders (typically about 1 to 100 microns in diameter) are accelerated in a supersonic gas jet to velocities up to about 1200 m/s. During impact with the target surface, particles undergo plastic deformation and adhere to the target surface, To achieve a uniform thickness, the spraying nozzle may be scanned along the target surface. The kinetic energy of the particles, supplied by the expansion of the gas, is converted to plastic deformation energy during bonding. Unlike thermal spraying techniques, such as plasma spraying, arc spraying, flame spraying, or high velocity oxygen fuel (HVOF), the powders are in general not melted during the spraying process.

Metals, polymers, ceramics, composite materials and nanocrystalline powders can be deposited using cold spraying.

A material structure provided by way of cold spraying (cold spray structure, which in the case of FIG. 1, includes the inductor structure 114 (such as electrically conductive structures 116 and magnetic structure 117), and which, in the case of FIG. 2, includes the magnetic structure 217, may present signature physical features and/or may be accompanied by signature physical features of surrounding structures, for example as discernible through a cross section viewed with the use of electron microscopy, such as a scanning electron microscopy (SEM) or transmission electron microscopy (TEM). The signature physical features may, for the electrically conductive structures 116, magnetic structure 117 or magnetic structure 217, when cold-sprayed, include a non-amorphous, granular microstructure including disordered or randomly distributed grains or particles. The particles may each have dimensions in the order of from 1 micron to 10 s of microns up to about 100 microns, and may present substantially non-linear particle to particle interfaces, for example when viewed at high magnification as noted above, for example a magnification at a scale of about 500 nm. The particle to particle interfaces are "substantially non-linear" as compared with particle to particle interfaces of plated metal materials when viewed at a same magnification. The cold sprayed material may further have a maximum porosity of 5% throughout. Signature physical features of surrounding structures may include the presence of a buffer layer. According to one embodiment, the buffer layer may, such as buffer layer 122/222 have a footprint shape that in general corresponds to the footprint shape of the cold sprayed structure, but which may have been patterned to present portions that extend beyond the footprint of the cold sprayed structure, for example portions 119/219. The buffer layer 122/222 may be made of a lower (adjacent the lower buildup layer) layer including titanium or tantalum, and an upper layer made of a soft metal, such as indium, silver, gold, tin, lead, and related alloys.

Buffer layer 122/222 may be provided by way of, for example, electroless plating or PVD, and may include a first layer adjacent the buildup layer 107 including, by way of example, titanium or tantalum, and a second layer to be disposed adjacent the inductor structure, the second layer including, by way of example, a soft metal such as indium, silver, gold, tin, lead, and related alloys.

A cold spray structure in general cannot be deposited directly on the currently available organic buildup dielectrics of the buildup layer, such as buildup layer 107/207, since the cold spray delivers particles at a high speed, for example supersonic speeds, which would likely crater and damage the dielectric. A thin buffer layer including titanium topped with gold, or titanium topped with copper would avoid the latter consequence, by both adhering to the organic dielectric material (e.g. by virtue of the titanium), and by providing a soft-enough layer on top that would allow for the cold spray material to be deposited on top of it.

The buffer layer 122/222 could include an insulating material adjacent the lower buildup layer, for example to prevent shorting to other structures, and it could further include an insulating material adjacent the upper buildup layer for the same reason, especially when it is not patterned to have a shape corresponding generally to the footprint shape of the cold spray structure.

When viewed at high magnification, for example through electron microscopy, the interface between the buffer layer 122/222 and the inductor structure 114 or magnetic structure 217 may present a non-flat configuration, for example as compared with an interface between power planes and the underlying buildup layer dielectric, where some particles of the cold-spray structure are at least in part embedded within indentations of the upper material of the buffer layer. It is for this reason that a soft metal as the upper material of the buffer layer would be beneficial to receive a cold sprayed material formed thereon in an additive manner, as it would allow a secure mechanical bonding of the cold sprayed magnetic structure to the underlying buildup layer.

The magnetic structure 117/217 may include a non-electrically conductive magnetic material. Preferably, the magnetic structure does not include an organic material, although it may. By "non-electrically conductive" in the context of embodiments, what is meant is "having a bulk resistivity of at least 1 ohm-cm." The magnetic structure may, for example, include particles made of a same material (homogenous particles made of a magnetic material); or particles made of different materials (non-homogenous particles including magnetic and non-magnetic particles) including at least one of: (1) particles including iron oxide particles or chromium dioxide particles; or (2) particles forming a composite including: a. at least one of aluminum oxide particles, silicon nitride, or iron nitride particles; and b. at least one of iron nickel particles or samarium cobalt particles; or c. particles forming a composite including vanadium ferrite particles and vanadium oxide particles; or (3) particles forming a composite including: a. at least one of silicon, silicon dioxide, or aluminum oxide; and b. neodymium. The magnetic structure may have a suitable relative permeability, for example, a relative permeability to allow it to be used as a core of an inductor structure having electrically conductive structures therein. The magnetic structure preferably has a relative permeability above 1000, preferably one in the order of 1000's, 10,000's or 100,000's.

Figure 3:
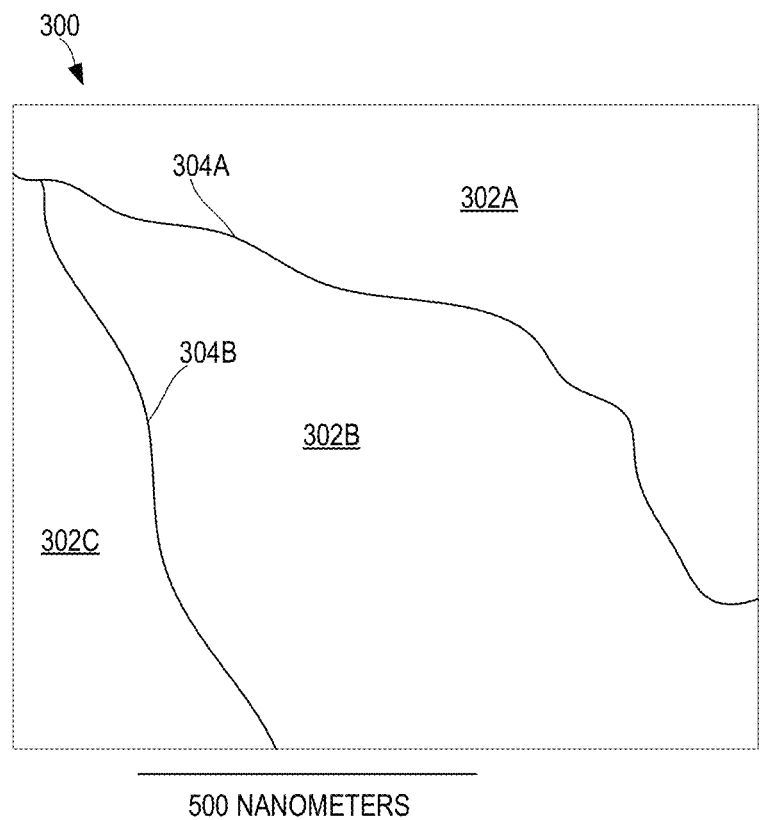
FIG. 3 illustrates a magnified view of a cold spray structure.

Referring now to FIG. 3, in one embodiment, an illustration 300 of a magnified view of a cold spray structure (such as the traces 116/216 or the magnetic structure 117/217) is shown. The illustration 300 has a scale in the form of a line at the bottom, which has a width of 500 nanometers. The illustration shows several particles 302, such as particle 302A, particle 302B, and particle 302C. In the illustrative embodiment, each particle 302A-C has a length, width, height, and/or diameter of, e.g., 10-100 microns. Particle boundaries (such as particle boundary 304A, 304B) are present between the various particles 302A-C. The particle boundaries are visible in, e.g., a scanning electron microscope image taken of a cross-section of a cold spray structure.

Figure 4:
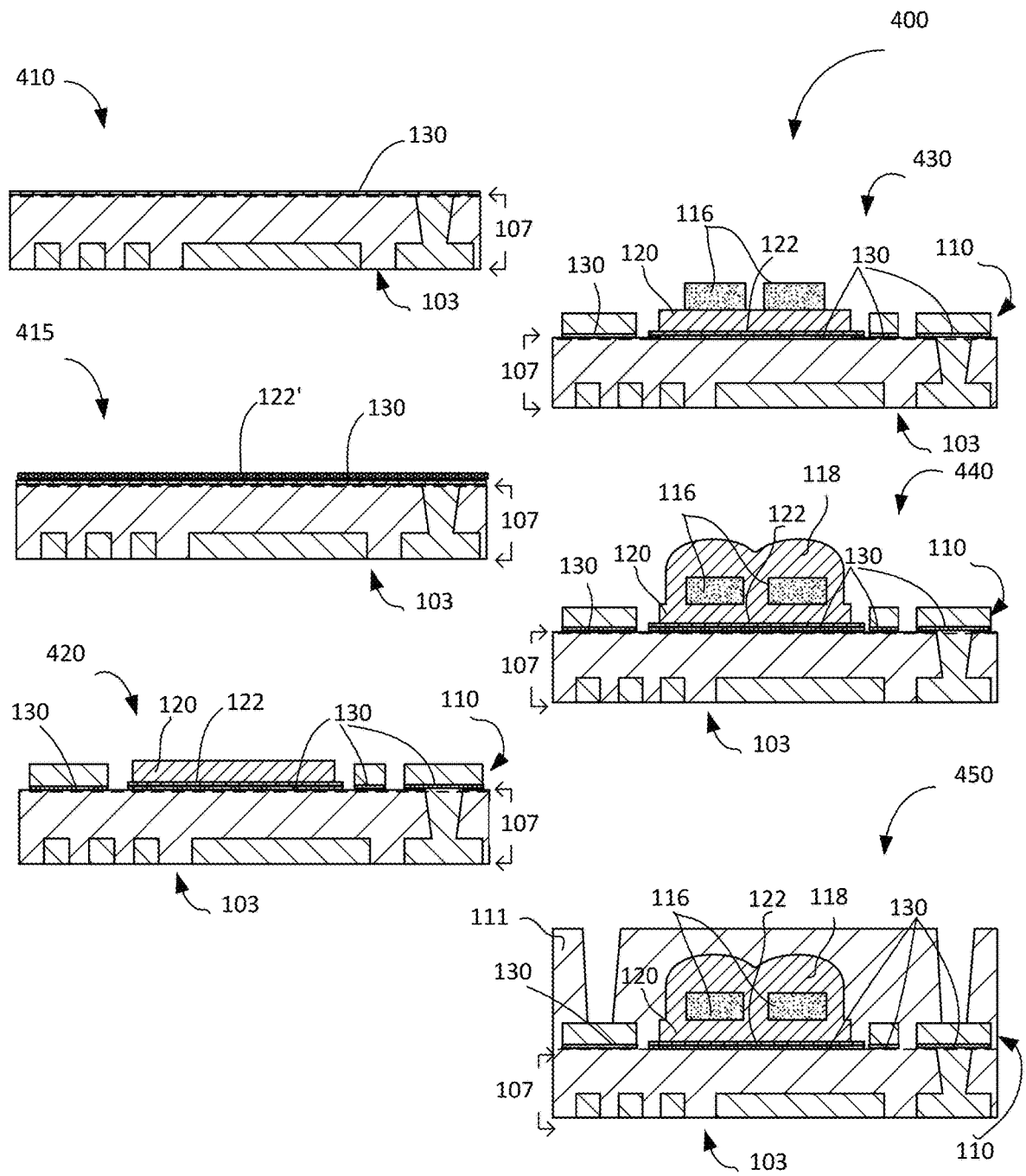
FIG. 4 illustrates a manufacturing process for the inductor architecture of FIG. 1.
Figure 5:
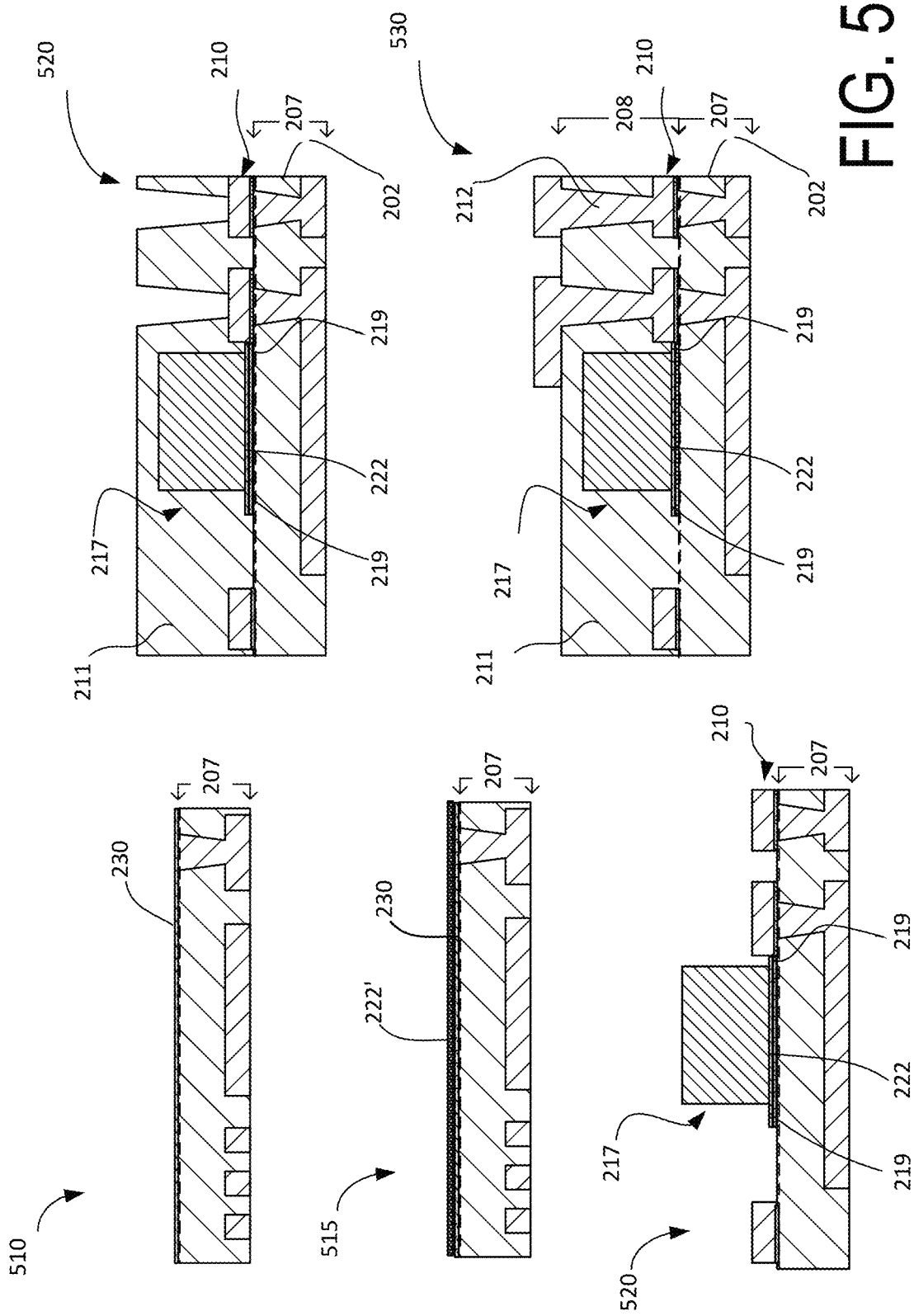
FIG. 5 illustrates a manufacturing process for the inductor architecture of FIG. 2.

An example manufacturing process is illustrated in FIG. 4 for the inductor architecture of FIG. 1. An example manufacturing process is illustrated in FIG. 5 for the inductor architecture of FIG. 2.

"Patterning" as used below may refer to any suitable patterning technique, such as, for example, a lithographic process involving etching.

In FIG. 4, the example process 400 is a simplified process and illustrates only certain operations that may be performed for manufacturing an inductor architecture 114 in accordance with the present disclosure. In some cases, the process 400 may include fewer, additional or different operations steps than those illustrated and described below.

At 410, a seed layer 130 (not shown specifically in FIG. 1 but may be present in FIG. 1) is deposited on buildup layer 107 of substrate 103. The seed layer 130 may be deposited, for example by way of electroless plating. For example, a catalyst such as palladium (Pd) may be deposited followed by an electroless copper plating process. In an alternate embodiment a physical vapor deposition (PVD) (e.g. sputtering) technique may be used to deposit the seed layer 130. The seed layer may be formed according to other suitable techniques. Seed layer 130 is provided for the initiation of the electrochemical deposition of power planes 110. The seed layer may include an electrically conductive material. Optionally, a barrier layer (not shown) may be provided between the seed layer and the buildup layer 107.

At 415, in the example embodiment a buffer layer 122' may be deposited on the seed layer 130, such as by using sputtering. The buffer layer 122' may, after being patterned, yield buffer layer 122 as described above.

At 420, a metal layer 110 is shown as having been deposited on a patterned version of seed layer 130 above buildup layer 107 of substrate 103. In addition, at 420, a first magnetic portion 120 of magnetic structure 117 may be deposited over the buffer layer 122'. The first magnetic portion 120 may be deposited via a cold spray process, e.g., patterned by using a shadow mask during deposition.

The seed/buffer layers may be blanket deposited. The metal layers 110 may be electroplated with a semi-additive process, and the magnetic material may be deposited with cold spray using a shadow mask to pattern as deposited. Then the seed/buffer outside the metal and cold spray material regions may be removed by flash etch. Lithography may be used, according to an example, only in the semi-additive process for the metal traces.

The metal layer 110 may include any suitable electrically conductive material, such as, for example, Cu. Ag. Al, Au, W, Zn and Ni. The deposited metal layer 110 may be a pure metal (e.g., copper, aluminum, etc.) or a composite (e.g., copper with diamond or silica fillers) e.g., for improved mechanical and/or thermal performance. The metal layer 110 may be deposited using electroplating, or sputtering, or high-throughput additive manufacturing (HTAM) such as cold spray. The metal layer 110. may be patterned, such as via etching, to form power planes 110. Thereafter, seed layer 130 may be patterned, such as via etching, to form buffer layer 122'

The buffer layer 122' may be deposited before the metal layer 110 (as shown in FIG. 4) or after the metal layer 110 (e.g. after the power plane 110 has been formed by way of deposition and patterning). The buffer layer 122' may further be patterned before the metal layer 110 (e.g. as described above in relation to FIG. 4) or after the metal layer 110.

Optionally, the additional buffer layer 122', and the resulting buffer layer 122, may be omitted, and the seed layer may serve as an effective buffer layer for cold spray deposition, in this way serving the dual purpose of a seed layer and a buffer layer.

During the cold spray process at operation 420, the buffer layer 122 may serve as a barrier to protect the underlying dielectric material of the buildup layer 107. Since it may be difficult to aim the cold spray jet exactly at the edge regions of the buffer layer 122, such buffer layer 122 presents extension regions 119 in order to provide a tolerance for the aiming of the cold spray jet toward the buildup layer 107.

At 430, electrically conductive structures 116 may be provided onto the first magnetic portion 120 via cold spray. The electrically conductive structures may include an electrically conductive material, such as any of the ones listed herein, for example, Cu. Optionally, fly cutting or other smoothing or planarization technique may be applied to the electrically conductive structures after cold spray deposition.

At 440, a second magnetic portion 118 of magnetic structure 117 may be deposited over the first magnetic portion 120 and the electrically conductive structures 116 such that it forms the magnetic structure encapsulating the electrically conductive structures. The second magnetic portion 120 may be deposited via a cold spray process, e.g. blanket deposited, similar to the first magnetic portion 120. The first magnetic portion and the second magnetic portion together form the magnetic structure 117.

At 450, dielectric layer 111 may be deposited onto the inductor structure 114 such that it encapsulates the same in a conformal manner as shown. Where the dielectric layer includes ABF, a nitride layer may be deposited on the assembly shown at operation 440, including the inductor structure 114 and power planes 204. The nitride layer would help in the adhesion of the ABF layer to the assembly shown at operation 440. After provision of the second magnetic layer 118, there may exist an option to provide roughening of the metal layers 110 for subsequent ABF adhesion, although doing so may create a chemical interaction with the magnetic structure 117. However, a desmear process may be omitted, as a roughening chemistry for metal layers such as copper may not work on the magnetic material. Instead, a thin nitride adhesion layer may be used for adhesion of ABF to all other materials, and may be deposited for example using sputtering, or any other known technique.

In addition, at 460, one or more via holes 131 may be laser drilled into the dielectric layer 111 to expose a portion of the underlying metal layer 110. Any conventional technique may be used to laser drill the via holes, such as one employing carbon dioxide (CO2) laser. Other suitable techniques to form via holes may also be used. If an adhesion nitride layer was provided on the structure of operation 450, this nitride layer may be removed from the vias during their creation by laser ablation and subsequent via bottom clean.

After operation 460, the via holes may be filled, for example, with an electrolytic plating process, such as an electrolytic copper plating process.

In the manufacturing process illustrated in FIG. 4, there is a possible interaction of the magnetic material of the magnetic structure 117 with a wet chemistry may occur in only one instance, which corresponds with the etch of the seed layer 130. Although the seed etch may be necessary, the seed etch may correspond, for example as per the description above in relation to operation 420, with the etch process as for the buffer layer 122' used for cold spray deposition, therefore minimizing bath contamination of the magnetic structure 117.

After operation 460, additional operations may be performed in order to arrive at the structure of FIG. 1, including filling the via holes with a conductive material.

In FIG. 5, the example process 500 is a simplified process and illustrates only certain operations that may be performed for manufacturing an inductor architecture 214 in accordance with the present disclosure. In some cases, the process 500 may include fewer, additional, or different operations/steps than those illustrated and described below.

At 510, a seed layer 233 (not shown specifically in FIG. 1 but may be present in FIG. 1) is deposited on buildup layer 207 of substrate 203. The seed layer 233 may be deposited, for example by way of electroless plating. For example, a catalyst such as palladium (Pd) may be deposited followed by an electroless copper plating process. In an alternate embodiment. a physical vapor deposition (PVO) (e.g., sputtering) technique may be used to deposit the seed layer 233. The seed layer may be formed according to other suitable techniques. Seed layer 233 is provided for the initiation of the electrochemical deposition of power planes 210. The seed layer may include an electrically conductive material. Optionally, a barrier layer (not shown) may be provided between the seed layer and the buildup layer 207.

At 515, in the example embodiment a buffer layer 222' may be deposited on the seed layer 233, such as by using sputtering. The buffer layer 222' may, after being patterned, may yield buffer layer 222 as described above.

At 520, a metal layer 210 is shown as having been deposited on a patterned version of seed layer 233 above buildup layer 207 of substrate 203. In addition. at 520, magnetic structure 217 has been deposited over the buffer layer 222' The magnetic structure 217 may be deposited via a cold spray process, e.g., blanket deposited and optionally patterned.

The patterning of the double layer including seed layer 233 and buffer layer 222' provided at operation 510 and 520 may occur in any order to allow the formation of a structure such as the one shown in the context of operation 530. For example, the buffer layer 222' may be patterned to a desired pattern, or footprint shape, to form buffer layer 222' Thereafter, the metal layer 210 may be deposited on the exposed portions of the seed layer 233. Thereafter, the metal layer 210, and underlying seed layer 233. may be patterned using for example, lithography and a wet etch process. Thereafter. the metal layer 110, and underlying seed layer 130, may be patterned using for example, lithography and a wet etch process. The metal layer 110 and seed layer 130 may be patterned separately or together. Other flows for achieving the assembly at 420 are also possible.

The metal layer 210 may include any suitable electrically conductive material, such as, for example, Cu, Ag, AL Au, W, Zn and Ni. The deposited metal layer 210 may be a pure metal (e.g., copper, aluminum, etc.) or a composite (e.g., copper with diamond or silica fillers) e.g. for improved mechanical and/or thermal performance. The metal layer 21o may be deposited using electroplating, or sputtering. or high-throughput additive manufacturing (HTAM) such as cold spray.

The buffer layer 222• may be deposited before the metal layer 21o• (as shown in FIG. 5) or after the metal layer 21o• (e.g. after the power plane 210 has been formed by way of deposition and patterning). The buffer layer 222• may further be patterned before the metal layer 210• (e.g. as described above in relation to FIG. 5) or after the metal layer 210. Optionally, the additional buffer layer 222', and the resulting buffer layer 222, may be omitted, and the seed layer may serve as an effective buffer layer for cold spray deposition, in this way serving the dual purpose of a seed layer and a buffer layer.

During the cold spray process at operation 520. the buffer layer 222 may serve as a barrier to protect the underlying dielectric material of the buildup layer 207. Since it may be difficult to aim the cold spray jet exactly at the edge regions of the buffer layer 222, such buffer layer 222 presents extension regions 219 in order to provide a tolerance for the aiming of the cold spray jet toward the buildup layer 207.

At 530, dielectric layer 211 may be deposited onto the magnetic structure 217 such that it encapsulates the same in a conformal manner as shown. Where the dielectric layer includes ABF, a nitride layer may be deposited on the assembly shown at operation 520, including the magnetic structure 217 and power planes 210 and 216c. The nitride layer would help in the adhesion of the ABF layer to the assembly shown at operation 520. There may exist an option to provide roughening of the metal layers 210 and 216c for subsequent ABF adhesion, although doing so may create a chemical interaction with the magnetic structure 217. However, a desmear process may be omitted, as a roughening chemistry for metal layers such as copper may not work on the magnetic material. Instead, a thin nitride adhesion layer may be used for adhesion of ABF to all other materials, and may be deposited for example using sputtering, or any other known technique.

Still at 530, one or more via holes 231 may be laser drilled into the dielectric layer 211 to expose a portion of the underlying metal layer 210 and metal layer 216c. Any conventional technique may be used to laser drill the via holes, such as one employing carbon dioxide (CO2) laser. Other suitable techniques to form via holes may also be used. If an adhesion nitride layer was provided on the structure of operation 520. this nitride layer may be removed from the vias during their creation by laser ablation and subsequent via bottom clean.

After operation 550, the via holes may be filled with a conductive material, for example, with an electrolytic plating process. such as an electrolytic copper plating process.

After operation 550, additional operations may be performed in order to arrive at the structure of FIG. 2, including buildup layer 209 comprising dielectric 221 and power planes 215 and 216a.

An inductor structure according to some embodiments may have electrically conductive structures having a minimum thickness (as measured in a direction from the buildup layer 107/207 toward the buildup layer 108/208), of about 50 microns, and could reach up to 100 microns, or even 200 microns if needed. Either of the magnetic portions 118, 120 of FIG. 1, or the magnetic structure 217 of FIG. 2, may have a minimum thickness of about 10 microns, and could reach up to 100 microns or more. In the embodiment of FIG. 1, the electrically conductive structures 116 as seen in cross section AA' may have a spacing between them of between about 50 microns and about 100 microns, and a width, as measured in the AA' direction, between about 50 microns and about 100 microns, or possibly even more.

Figure 6:
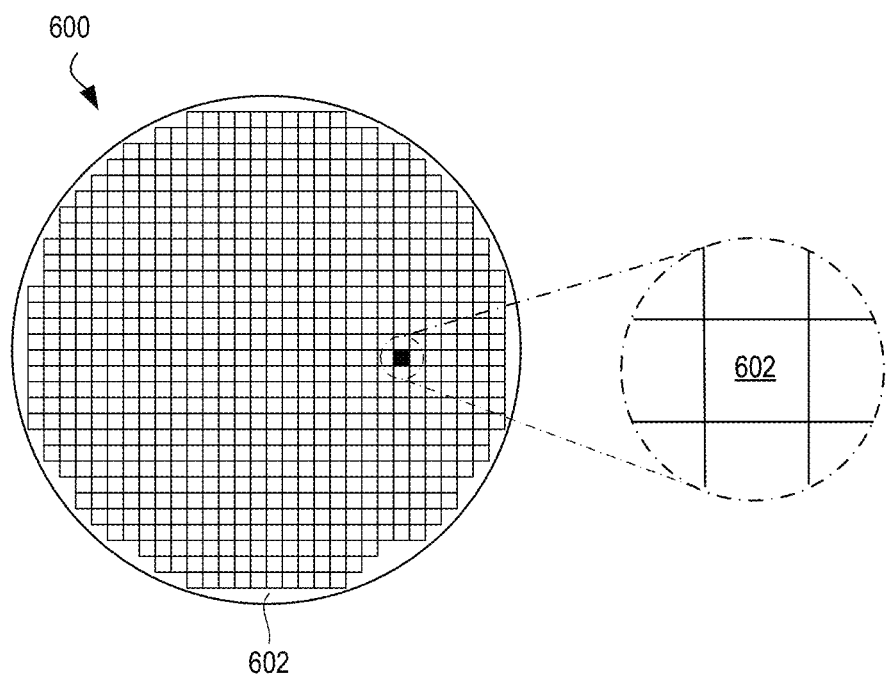
FIG. 6 is a top view of a wafer and dies that may be included in a microelectronic assembly, in accordance with any of the embodiments disclosed herein.

FIG. 6 is a top view of a wafer 600 and dies 602 to be included in a package that may include any of the inductor structures according to embodiments as disclosed herein, for example in the context of the examples of FIG. 1 or 2. The wafer 600 may be composed of semiconductor material and may include one or more dies 602 having integrated circuit structures formed on a surface of the wafer 600. The individual dies 602 may be a repeating unit of an integrated circuit product that includes any suitable integrated circuit. After the fabrication of the semiconductor product is complete, the wafer 600 may undergo a singulation process in which the dies 602 are separated from one another to provide discrete "chips" of the integrated circuit product. The die 602 may include one or more transistors (e.g., some of the transistors 740 of FIG. 7, discussed below), supporting circuitry to route electrical signals to the transistors, passive components (e.g., signal traces, resistors, capacitors, or inductors), and/or any other integrated circuit components. In some embodiments, the wafer 600 or the die 602 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processor unit (e.g., the processor unit 902 of FIG. 9) or other logic that is configured to store information in the memory devices or execute instructions stored in the memory array. Various embodiments disclosed herein may be manufactured using a die-to-wafer assembly technique in which some dies are attached to a wafer 600 that include others of the dies, and the wafer 600 is subsequently singulated.

Figure 7:
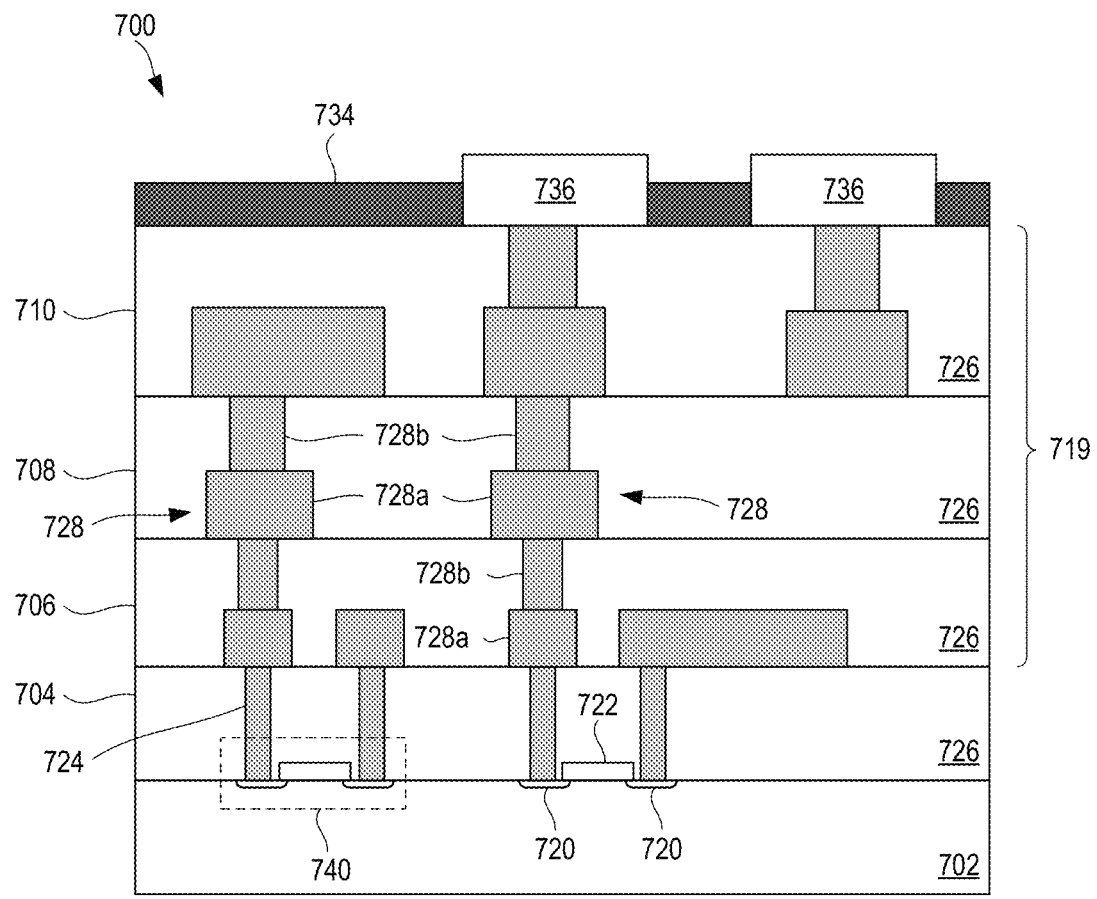
FIG. 7 is a cross-sectional side view of an integrated circuit device that may be included in a microelectronic assembly, in accordance with any of the embodiments disclosed herein.

FIG. 7 is a cross-sectional side view of an integrated circuit device 700 that may be made part of a package that includes any of the inductor structures disclosed herein. One or more of the integrated circuit devices 700 may be included in one or more dies 602 (FIG. 6). The integrated circuit device 700 may be formed on a die substrate 702 (e.g., the wafer 600 of FIG. 6) and may be included in a die (e.g., the die 602 of FIG. 6). The die substrate 702 may be a semiconductor substrate composed of semiconductor material systems including, for example, n-type or p-type materials systems (or a combination of both). The die substrate 702 may include, for example, a crystalline substrate formed using a bulk silicon or a silicon-on-insulator (SOI) substructure. In some embodiments, the die substrate 702 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 702. Although a few examples of materials from which the die substrate 702 may be formed are described here, any material that may serve as a foundation for an integrated circuit device 700 may be used. The die substrate 702 may be part of a singulated die (e.g., the dies 602 of FIG. 6) or a wafer (e.g., the wafer 600 of FIG. 6).

The integrated circuit device 700 may include one or more device layers 704 disposed on the die substrate 702. The device layer 704 may include features of one or more transistors 740 (e.g., metal oxide semiconductor field-effect transistors (MOSFETs)) formed on the die substrate 702. The transistors 740 may include, for example, one or more source and/or drain (S/D) regions 720, a gate 722 to control current flow between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 740 may include a gate 722 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 740 along the source-channel-drain direction, the gate electrode may consist of a U-shaped structure that includes a bottom portion substantially parallel to the surface of the die substrate 702 and two sidewall portions that are substantially perpendicular to the top surface of the die substrate 702. In other embodiments, at least one of the metal layers that form the gate electrode may simply be a planar layer that is substantially parallel to the top surface of the die substrate 702 and does not include sidewall portions substantially perpendicular to the top surface of the die substrate 702. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the die substrate 702 adjacent to the gate 722 of individual transistors 740. The S/D regions 720 may be formed using an implantation/diffusion process or an etching/deposition process, for example. In the former process, dopants such as boron, aluminum, antimony, phosphorous, or arsenic may be ion-implanted into the die substrate 702 to form the S/D regions 720. An annealing process that activates the dopants and causes them to diffuse farther into the die substrate 702 may follow the ion-implantation process. In the latter process, the die substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the devices (e.g., transistors 740) of the device layer 704 through one or more interconnect layers disposed on the device layer 704 (illustrated in FIG. 7 as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form a metallization stack (also referred to as an "ILD stack") 719 of the integrated circuit device 700.

The interconnect structures 728 may be arranged within the interconnect layers 706-710 to route electrical signals according to a wide variety of designs; in particular, the arrangement is not limited to the particular configuration of interconnect structures 728 depicted in FIG. 7. Although a particular number of interconnect layers 706-710 is depicted in FIG. 7, embodiments of the present disclosure include integrated circuit devices having more or fewer interconnect layers than depicted.

In some embodiments, the interconnect structures 728 may include lines 728*a* and/or vias 728*b* filled with an electrically conductive material such as a metal. The lines 728*a* may be arranged to route electrical signals in a direction of a plane that is substantially parallel with a surface of the die substrate 702 upon which the device layer 704 is formed. For example, the lines 728*a* may route electrical signals in a direction in and out of the page and/or in a direction across the page from the perspective of FIG. 13. The vias 728*b* may be arranged to route electrical signals in a direction of a plane that is substantially perpendicular to the surface of the die substrate 702 upon which the device layer 704 is formed. In some embodiments, the vias 728*b* may electrically couple lines 728*a* of different interconnect layers 706-710 together.

The interconnect layers 706-710 may include a dielectric material 726 disposed between the interconnect structures 728, as shown in FIG. 7. In some embodiments, dielectric material 726 disposed between the interconnect structures 728 in different ones of the interconnect layers 706-710 may have different compositions; in other embodiments, the composition of the dielectric material 726 between different interconnect layers 706-710 may be the same. The device layer 704 may include a dielectric material 726 disposed between the transistors 740 and a bottom layer of the metallization stack as well. The dielectric material 726 included in the device layer 704 may have a different composition than the dielectric material 726 included in the interconnect layers 706-710; in other embodiments, the composition of the dielectric material 726 in the device layer 704 may be the same as a dielectric material 726 included in any one of the interconnect layers 706-710.

A first interconnect layer 706 (referred to as Metal 1 or "M1") may be formed directly on the device layer 704. In some embodiments, the first interconnect layer 706 may include lines 728*a* and/or vias 728*b*, as shown. The lines 728*a* of the first interconnect layer 706 may be coupled with contacts (e.g., the S/D contacts 724) of the device layer 704. The vias 728*b* of the first interconnect layer 706 may be coupled with the lines 728*a* of a second interconnect layer 708.

The second interconnect layer 708 (referred to as Metal 2 or "M2") may be formed directly on the first interconnect layer 706. In some embodiments, the second interconnect layer 708 may include via 728*b* to couple the lines 728 of the second interconnect layer 708 with the lines 728*a* of a third interconnect layer 710. Although the lines 728*a* and the vias 728*b* are structurally delineated with a line within individual interconnect layers for the sake of clarity, the lines 728*a* and the vias 728*b* may be structurally and/or materially contiguous (e.g., simultaneously filled during a dual-damascene process) in some embodiments.

The third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706. In some embodiments, the interconnect layers that are "higher up" in the metallization stack 719 in the integrated circuit device 700 (i.e., farther away from the device layer 704) may be thicker that the interconnect layers that are lower in the metallization stack 719, with lines 728a and vias 728b in the higher interconnect layers being thicker than those in the lower interconnect layers.

The integrated circuit device 700 may include a solder resist material 734 (e.g., polyimide or similar material) and one or more conductive contacts 736 formed on the interconnect layers 706-710. In FIG. 7, the conductive contacts 736 are illustrated as taking the form of bond pads. The conductive contacts 736 may be electrically coupled with the interconnect structures 728 and configured to route the electrical signals of the transistor(s) 740 to external devices. For example, solder bonds may be formed on the one or more conductive contacts 736 to mechanically and/or electrically couple an integrated circuit die including the integrated circuit device 700 with another component (e.g., a printed circuit board). The integrated circuit device 700 may include additional or alternate structures to route the electrical signals from the interconnect layers 706-710; for example, the conductive contacts 736 may include other analogous features (e.g., posts) that route the electrical signals to external components.

In some embodiments in which the integrated circuit device 700 is a double-sided die, the integrated circuit device 700 may include another metallization stack (not shown) on the opposite side of the device layer(s) 704. This metallization stack may include multiple interconnect layers as discussed above with reference to the interconnect layers 706-710, to provide conductive pathways (e.g., including conductive lines and vias) between the device layer(s) 704 and additional conductive contacts (not shown) on the opposite side of the integrated circuit device 700 from the conductive contacts 736.

In other embodiments in which the integrated circuit device 700 is a double-sided die, the integrated circuit device 700 may include one or more through silicon vias (TSVs) through the die substrate 702; these TSVs may make contact with the device layer(s) 704, and may provide conductive pathways between the device layer(s) 704 and additional conductive contacts (not shown) on the opposite side of the integrated circuit device 700 from the conductive contacts 736. In some embodiments, TSVs extending through the substrate can be used for routing power and ground signals from conductive contacts on the opposite side of the integrated circuit device 700 from the conductive contacts 736 to the transistors 740 and any other components integrated into the die 700, and the metallization stack 719 can be used to route I/O signals from the conductive contacts 736 to transistors 740 and any other components integrated into the die 700.

Multiple integrated circuit devices 700 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 8:
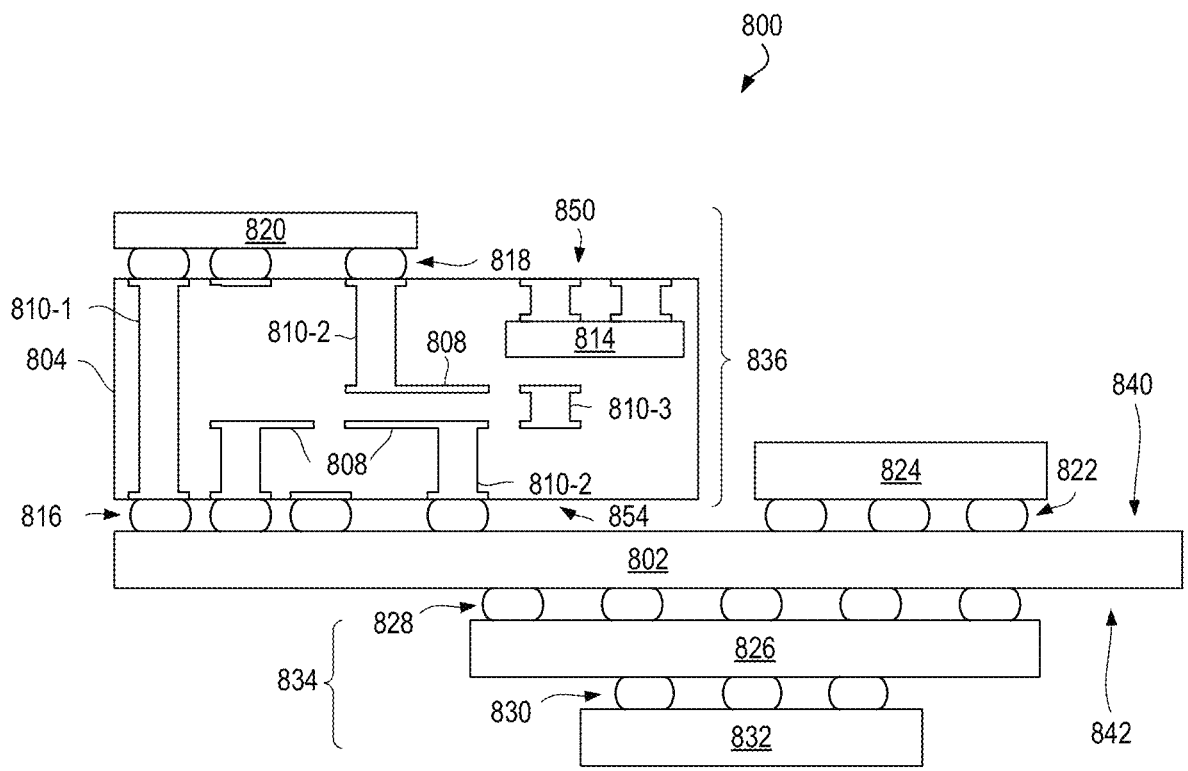
FIG. 8 is a cross-sectional side view of an integrated circuit device assembly that may include a microelectronic assembly, in accordance with any of the embodiments disclosed herein.

FIG. 8 is a cross-sectional side view of an integrated circuit device assembly 800 that may include any of the inductor structures disclosed herein. In some embodiments, the integrated circuit device assembly 800 may be a microelectronic assembly. The integrated circuit device assembly 800 includes a number of components disposed on a circuit board 802 (which may be a motherboard, system board, mainboard, etc.). The integrated circuit device assembly 800 includes components disposed on a first face 840 of the circuit board 802 and an opposing second face 842 of the circuit board 802; generally, components may be disposed on one or both faces 840 and 842.

In some embodiments, the circuit board 802 may be a printed circuit board (PCB) including multiple metal (or interconnect) layers separated from one another by layers of dielectric material and interconnected by electrically conductive vias. The individual metal layers comprise electrically conductive structures. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate. The integrated circuit device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 836 may include an integrated circuit component 820 coupled to an interposer 804 by coupling components 818. The coupling components 818 may take any suitable form for the application, such as the forms discussed above with reference to the coupling components 816. Although a single integrated circuit component 820 is shown in FIG. 8, multiple integrated circuit components may be coupled to the interposer 804; indeed, additional interposers may be coupled to the interposer 804. The interposer 804 may provide an intervening substrate used to bridge the circuit board 802 and the integrated circuit component 820.

The integrated circuit component 820 may be a packaged or unpacked integrated circuit product that includes one or more integrated circuit dies (e.g., the die 602 of FIG. 6, the integrated circuit device 700 of FIG. 7) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 820, a single monolithic integrated circuit die comprises solder bumps attached to contacts on the die. The solder bumps allow the die to be directly attached to the interposer 804. The integrated circuit component 820 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 820 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 820 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 820 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 804 may spread connections to a wider pitch or reroute a connection to a different connection. For example, the interposer 804 may couple the integrated circuit component 820 to a set of ball grid array (BGA) conductive contacts of the coupling components 816 for coupling to the circuit board 802. In the embodiment illustrated in FIG. 8, the integrated circuit component 820 and the circuit board 802 are attached to opposing sides of the interposer 804; in other embodiments, the integrated circuit component 820 and the circuit board 802 may be attached to a same side of the interposer 804. In some embodiments, three or more components may be interconnected by way of the interposer 804.

In some embodiments, the interposer 804 may be formed as a PCB, including multiple metal layers separated from one another by layers of dielectric material and interconnected by electrically conductive vias. In some embodiments, the interposer 804 may be formed of an epoxy resin, a fiberglass-reinforced epoxy resin, an epoxy resin with inorganic fillers, a ceramic material, or a polymer material such as polyimide. In some embodiments, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through hole vias 810-1 (that extend from a first face 850 of the interposer 804 to a second face 854 of the interposer 804), blind vias 810-2 (that extend from the first or second faces 850 or 854 of the interposer 804 to an internal metal layer), and buried vias 810-3 (that connect internal metal layers).

In some embodiments, the interposer 804 can comprise a silicon interposer. Through silicon vias (TSV) extending through the silicon interposer can connect connections on a first face of a silicon interposer to an opposing second face of the silicon interposer. In some embodiments, an interposer 804 comprising a silicon interposer can further comprise one or more routing layers to route connections on a first face of the interposer 804 to an opposing second face of the interposer 804.

The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art. In embodiments where the interposer is a non-printed circuit board The integrated circuit device assembly 800 may include an integrated circuit component 824 coupled to the first face 840 of the circuit board 802 by coupling components 822. The coupling components 822 may take the form of any of the embodiments discussed above with reference to the coupling components 816, and the integrated circuit component 824 may take the form of any of the embodiments discussed above with reference to the integrated circuit component 820.

The integrated circuit device assembly 800 illustrated in FIG. 8 includes a package-on-package structure 834 coupled to the second face 842 of the circuit board 802 by coupling components 828. The package-on-package structure 834 may include an integrated circuit component 826 and an integrated circuit component 832 coupled together by coupling components 830 such that the integrated circuit component 826 is disposed between the circuit board 802 and the integrated circuit component 832. The coupling components 828 and 830 may take the form of any of the embodiments of the coupling components 816 discussed above, and the integrated circuit components 826 and 832 may take the form of any of the embodiments of the integrated circuit component 820 discussed above. The package-on-package structure 834 may be configured in accordance with any of the package-on-package structures known in the art.

Figure 9:
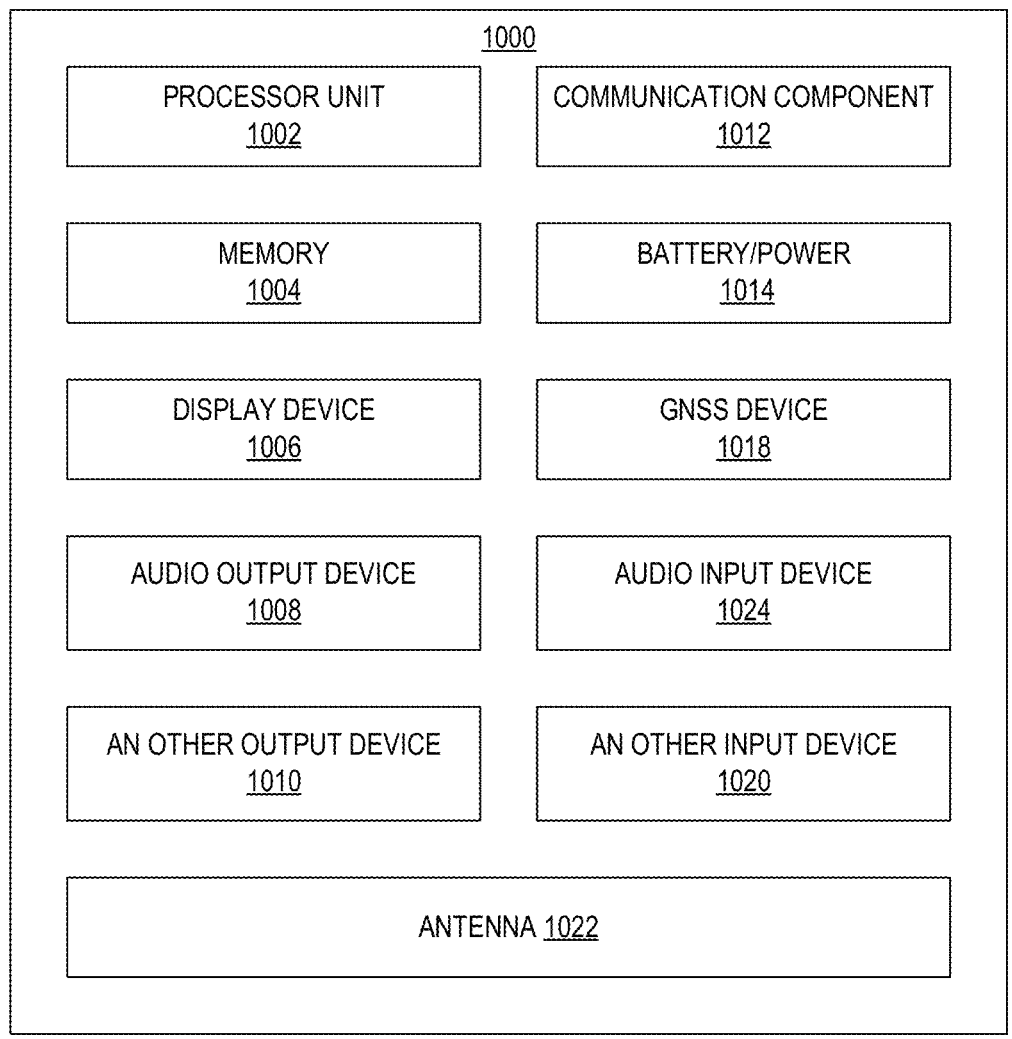
FIG. 9 is a block diagram of an example electrical system that may include a microelectronic assembly, in accordance with any of the embodiments disclosed herein.

FIG. 9 is a block diagram of an example electrical system 900 that may include one or more of the integrated circuit structures disclosed herein. For example, any suitable ones of the components of the electrical system 900 may include one or more of the integrated circuit device assemblies 800, integrated circuit components 820, integrated circuit devices 700, or integrated circuit dies 602 disclosed herein. A number of components are illustrated in FIG. 9 as included in the electrical system 900, but any one or more of these components may be omitted or duplicated, as suitable for the application. In some embodiments, some or all of the components included in the electrical system 900 may be attached to one or more motherboards mainboards, or system boards. In some embodiments, one or more of these components are fabricated onto a single system-on-a-chip (SoC) die.

Additionally, in various embodiments, the electrical system 900 may not include one or more of the components illustrated in FIG. 9, but the electrical system 900 may include interface circuitry for coupling to the one or more components. For example, the electrical system 900 may not include a display device 906, but may include display device interface circuitry (e.g., a connector and driver circuitry) to which a display device 906 may be coupled. In another set of examples, the electrical system 900 may not include an audio input device 924 or an audio output device 908, but may include audio input or output device interface circuitry (e.g., connectors and supporting circuitry) to which an audio input device 924 or audio output device 908 may be coupled.

The electrical system 900 may include one or more processor units 902 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 902 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical system 900 may include a memory 904, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 904 may include memory that is located on the same integrated circuit die as the processor unit 902. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical system 900 can comprise one or more processor units 902 that are heterogeneous or asymmetric to another processor unit 902 in the electrical system 900. There can be a variety of differences between the processing units 902 in a system in terms of a spectrum of metrics of merit including architectural, microarchitectural, thermal, power consumption characteristics, and the like. These differences can effectively manifest themselves as asymmetry and heterogeneity among the processor units 902 in the electrical system 900.

In some embodiments, the electrical system 900 may include a communication component 912 (e.g., one or more communication components). For example, the communication component 912 can manage wireless communications for the transfer of data to and from the electrical system 900. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 912 may operate in accordance with other wireless protocols in other embodiments. The electrical system 900 may include an antenna 922 to facilitate wireless communications and/or to receive other wireless communications (such as AM or FM radio transmissions).

In some embodiments, the communication component 912 may manage wired communications, such as electrical, optical, or any other suitable communication protocols (e.g., IEEE 802.3 Ethernet standards). As noted above, the communication component 912 may include multiple communication components. For instance, a first communication component 912 may be dedicated to shorter-range wireless communications such as Wi-Fi or Bluetooth, and a second communication component 912 may be dedicated to longer-range wireless communications such as global positioning system (GPS), EDGE, GPRS, CDMA, WiMAX, LTE, EV-DO, or others. In some embodiments, a first communication component 912 may be dedicated to wireless communications, and a second communication component 912 may be dedicated to wired communications.

The electrical system 900 may include battery/power circuitry 914. The battery/power circuitry 914 may include one or more energy storage devices (e.g., batteries or capacitors) and/or circuitry for coupling components of the electrical system 900 to an energy source separate from the electrical system 900 (e.g., AC line power).

The electrical system 900 may include a display device 906 (or corresponding interface circuitry, as discussed above). The display device 906 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical system 900 may include an audio output device 908 (or corresponding interface circuitry, as discussed above). The audio output device 908 may include any embedded or wired or wirelessly connected external device that generates an audible indicator, such speakers, headsets, or earbuds.

The electrical system 900 may include an audio input device 924 (or corresponding interface circuitry, as discussed above). The audio input device 924 may include any embedded or wired or wirelessly connected device that generates a signal representative of a sound, such as microphones, microphone arrays, or digital instruments (e.g., instruments having a musical instrument digital interface (MIDI) output). The electrical system 900 may include a Global Navigation Satellite System (GNSS) device 918 (or corresponding interface circuitry, as discussed above), such as a Global Positioning System (GPS) device. The GNSS device 918 may be in communication with a satellite-based system and may determine a geolocation of the electrical system 900 based on information received from one or more GNSS satellites, as known in the art.

The electrical system 900 may include an other output device 910 (or corresponding interface circuitry, as discussed above). Examples of the other output device 910 may include an audio codec, a video codec, a printer, a wired or wireless transmitter for providing information to other devices, or an additional storage device.

The electrical system 900 may include an other input device 920 (or corresponding interface circuitry, as discussed above). Examples of the other input device 920 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical system 900 may have any desired form factor, such as a hand-held or mobile electrical system (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical system, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical system or an embedded computing system (e.g., computing systems that are part of a vehicle, smart home appliance, consumer electronics product or equipment, manufacturing equipment). In some embodiments, the electrical system 900 may be any other electronic device that processes data. In some embodiments, the electrical system 900 may comprise multiple discrete physical components. Given the range of devices that the electrical system 900 can be manifested as in various embodiments, in some embodiments, the electrical system 900 can be referred to as a computing device or a computing system.

Figure 10:
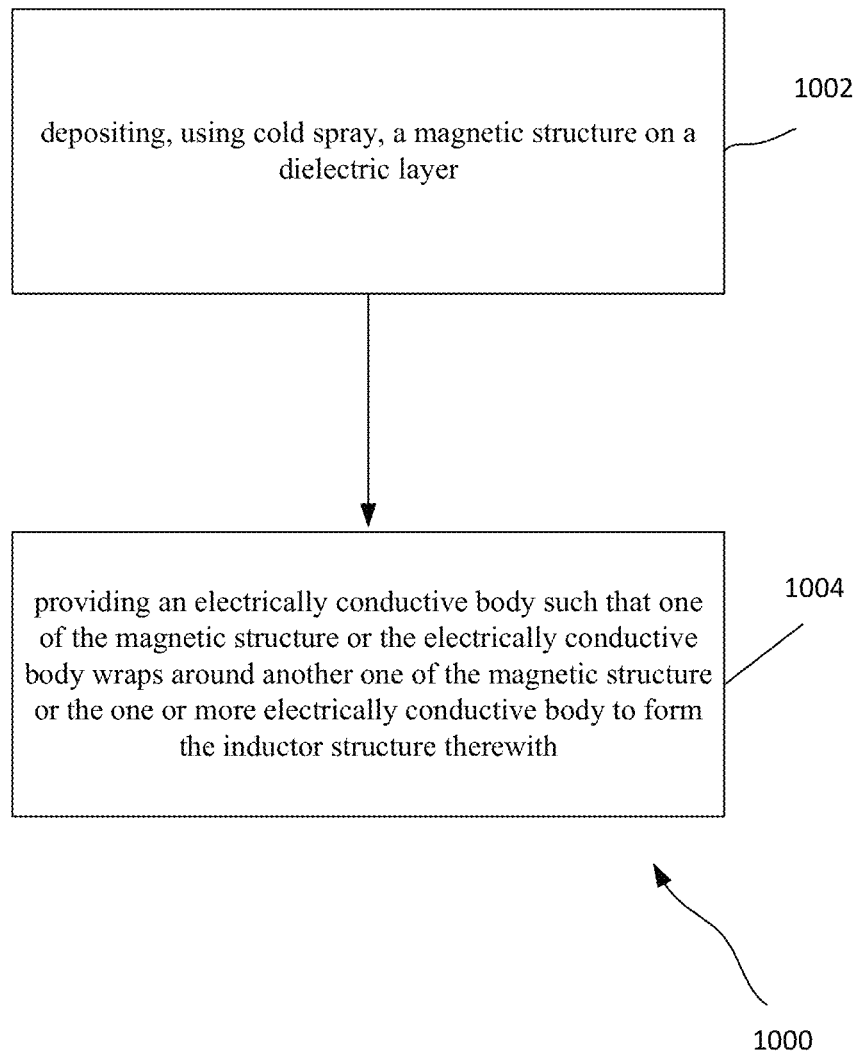
FIG. 10 is a process to manufacture an inductor structure according to an embodiment.

FIG. 10 shows a process 1000 to manufacture an inductor structure according to some embodiments. At operation 1010, the process includes depositing, using cold spray, a magnetic structure on a dielectric layer. At operation 1012, the process includes providing an electrically conductive body such that one of the magnetic structure or the electrically conductive body wraps around another one of the magnetic structure or the one or more electrically conductive body to form the inductor structure therewith.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

As used herein, an "integrated circuit structure" may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an inductor structure of a package substrate comprising a plurality of buildup layers, the inductor structure including: an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

Example 2 includes the subject matter of Example 1, wherein the magnetic structure conformally wraps around the electrically conductive body and is adjacent thereto.

Example 3 includes the subject matter of Example 1, wherein the electrically conductive body wraps around the magnetic structure.

Example 4 includes the subject matter of Example 1, wherein the particles have sizes ranging from about 10 microns to about 100 microns.

Example 5 includes the subject matter of Example 1, wherein the granular microstructure has a maximum porosity of about 5%.

Example 6 includes the subject matter of Example 1, wherein the magnetic material does not include an organic component.

Example 7 includes the subject matter of Example 1, wherein the magnetic material includes one of particles made of a same material or particles including both magnetic particles and non-magnetic particles.

Example 8 includes the subject matter of Example 7, wherein the magnetic material includes one of: particles including iron oxide; particles including chromium dioxide; particles forming a composite including: at least one of particles including aluminum oxide, silicon nitride, or iron nitride; and at least one of particles including iron nickel or samarium cobalt; or particles forming a composite including vanadium ferrite particles and vanadium oxide particles; or particles forming a composite including: at least one of particles including silicon, silicon dioxide, or aluminum oxide; and neodymium particles.

Example 9 includes the subject matter of Example 1, wherein at least one of: the electrically conductive body has a minimum thickness of about 10 microns; or the magnetic structure has a minimum thickness of about 10 microns.

Example 10 includes the subject matter of Example 1, further including a buffer layer adjacent to and between a surface of the inductor structure and a buildup layer adjacent said one of the buildup layers, wherein an interface between the buffer layer and the magnetic structure has a non-flat configuration as compared with an interface between the buildup layers, wherein some particles of the magnetic structure are at least in part embedded within indentations of the buffer layer.

Example 11 includes the subject matter of Example 10, wherein the buffer layer includes a layer presenting the interface between the buffer layer and the magnetic structure and made of indium, silver, gold, tin, lead, or alloys thereof.

Example 12 includes the subject matter of Example 10, wherein the buffer layer includes extension regions extending beyond a footprint shape of the inductor structure on the buildup layer adjacent said one of the buildup layers.

Example 13 includes a package substrate comprising a plurality of buildup layers, each of the buildup layers including a dielectric material, a power plane, and electrically conductive vias; and an inductor structure in one of the buildup layers, the inductor structure including: an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

Example 14 includes the subject matter of Example 13, wherein the magnetic structure conformally wraps around the electrically conductive body and is adjacent thereto.

Example 15 includes the subject matter of Example 13, wherein the electrically conductive body wraps around the magnetic structure.

Example 16 includes the subject matter of Example 13, wherein the particles have sizes ranging from about 10 microns to about 100 microns.

Example 17 includes the subject matter of Example 13, wherein the granular microstructure has a maximum porosity of about 5%.

Example 18 includes the subject matter of Example 13, wherein the magnetic material does not include an organic component.

Example 19 includes the subject matter of Example 13, wherein the magnetic material includes one of particles made of a same material or particles including both magnetic particles and non-magnetic particles.

Example 20 includes the subject matter of Example 19, wherein the magnetic material includes one of: particles including iron oxide; particles including chromium dioxide; particles forming a composite including: at least one of particles including aluminum oxide, silicon nitride, or iron nitride; and at least one of particles including iron nickel or samarium cobalt; or particles forming a composite including vanadium ferrite particles and vanadium oxide particles; or particles forming a composite including: at least one of particles including silicon, silicon dioxide, or aluminum oxide; and neodymium particles.

Example 21 includes the subject matter of Example 13, wherein at least one of: the electrically conductive body has a minimum thickness of about 10 microns; or the magnetic structure has a minimum thickness of about 10 microns.

Example 22 includes the subject matter of Example 13, further including a buffer layer adjacent to and between a surface of the inductor structure and a buildup layer adjacent said one of the buildup layers, wherein an interface between the buffer layer and the magnetic structure has a non-flat configuration as compared with an interface between the buildup layers, wherein some particles of the magnetic structure are at least in part embedded within indentations of the buffer layer.

Example 23 includes the subject matter of Example 22, wherein the buffer layer includes a layer presenting the interface between the buffer layer and the magnetic structure and made of indium, silver, gold, tin, lead, or alloys thereof.

Example 24 includes the subject matter of Example 22, wherein the buffer layer includes extension regions extending beyond a footprint shape of the inductor structure on the buildup layer adjacent said one of the buildup layers.

Example 25 includes the subject matter of Example 22, further including a metal layer between the buffer layer and the buildup layer adjacent said one of the buildup layers.

Example 26 includes an integrated circuit device including: an integrated circuit component including one or more dies; and a package substrate including a plurality of buildup layers, the integrated circuit component electrically and mechanically coupled to the package substrate, each of the buildup layers including a dielectric material, a power plane, and electrically conductive vias; and an inductor structure in one of the buildup layers, the inductor structure including: an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

Example 27 includes the subject matter of Example 26, wherein the magnetic structure conformally wraps around the electrically conductive body and is adjacent thereto.

Example 28 includes the subject matter of Example 26, wherein the electrically conductive body wraps around the magnetic structure.

Example 29 includes the subject matter of Example 26, wherein the particles have sizes ranging from about 10 microns to about 100 microns.

Example 30 includes the subject matter of Example 26, wherein the granular microstructure has a maximum porosity of about 5%.

Example 31 includes the subject matter of Example 26, wherein the magnetic material does not include an organic component.

Example 32 includes the subject matter of Example 26, wherein the magnetic material includes one of particles made of a same material or particles including both magnetic particles and non-magnetic particles.

Example 33 includes the subject matter of Example 32, wherein the magnetic material includes one of: particles including iron oxide; particles including chromium dioxide; particles forming a composite including: at least one of particles including aluminum oxide, silicon nitride, or iron nitride; and at least one of particles including iron nickel or samarium cobalt; or particles forming a composite including vanadium ferrite particles and vanadium oxide particles; or particles forming a composite including: at least one of particles including silicon, silicon dioxide, or aluminum oxide; and neodymium particles.

Example 34 includes the subject matter of Example 26, wherein at least one of: the electrically conductive body has a minimum thickness of about 10 microns; or the magnetic structure has a minimum thickness of about 10 microns.

Example 35 includes the subject matter of Example 26, further including a buffer layer adjacent to and between a surface of the inductor structure and a buildup layer adjacent said one of the buildup layers, wherein an interface between the buffer layer and the magnetic structure has a non-flat configuration as compared with an interface between the buildup layers, wherein some particles of the magnetic structure are at least in part embedded within indentations of the buffer layer.

Example 36 includes the subject matter of Example 35, wherein the buffer layer includes a layer presenting the interface between the buffer layer and the magnetic structure and made of indium, silver, gold, tin, lead, or alloys thereof.

Example 37 includes the subject matter of Example 35, wherein the buffer layer includes extension regions extending beyond a footprint shape of the inductor structure on the buildup layer adjacent said one of the buildup layers.

Example 38 includes an integrated circuit device assembly including: one or more processing units; a memory coupled to the one or more processing units; and an integrated circuit device coupled to the memory and to the one or more processing units, the integrated circuit device including: an integrated circuit component including one or more dies; and a package substrate including a plurality of buildup layers, the integrated circuit component electrically and mechanically coupled to the package substrate, each of the buildup layers including a dielectric material, a power plane, and electrically conductive vias; and an inductor structure in one of the buildup layers, the inductor structure including: an electrically conductive body; and a magnetic structure including a non-electrically-conductive magnetic material, wherein: one of the magnetic structure or the electrically conductive body wraps around another one of the magnetic structure or the electrically conductive body to form the inductor structure therewith; and at least one of the electrically conductive body or the magnetic structure has a granular microstructure including randomly distributed particles presenting substantially non-linear particle-to-particle boundaries with one another.

Example 39 includes the subject matter of Example 38, wherein the magnetic structure conformally wraps around the electrically conductive body and is adjacent thereto.

Example 40 includes the subject matter of Example 38, wherein the electrically conductive body wraps around the magnetic structure.

Example 41 includes the subject matter of Example 38, wherein the particles have sizes ranging from about 10 microns to about 100 microns.

Example 42 includes the subject matter of Example 38, wherein the granular microstructure has a maximum porosity of about 5%.

Example 43 includes the subject matter of Example 38, wherein the magnetic material does not include an organic component.

Example 44 includes the subject matter of Example 38, wherein the magnetic material includes one of particles made of a same material or particles including both magnetic particles and non-magnetic particles.

Example 45 includes the subject matter of Example 44, wherein the magnetic material includes one of: particles including iron oxide; particles including chromium dioxide; particles forming a composite including: at least one of particles including aluminum oxide, silicon nitride, or iron nitride; and at least one of particles including iron nickel or samarium cobalt; or particles forming a composite including vanadium ferrite particles and vanadium oxide particles; or particles forming a composite including: at least one of particles including silicon, silicon dioxide, or aluminum oxide; and neodymium particles.

Example 46 includes the subject matter of Example 38, wherein at least one of: the electrically conductive body has a minimum thickness of about 10 microns; or the magnetic structure has a minimum thickness of about 10 microns.

Example 47 includes the subject matter of Example 38, further including a buffer layer adjacent to and between a surface of the inductor structure and a buildup layer adjacent said one of the buildup layers, wherein an interface between the buffer layer and the magnetic structure has a non-flat configuration as compared with an interface between the buildup layers, wherein some particles of the magnetic structure are at least in part embedded within indentations of the buffer layer.

Example 48 includes the subject matter of Example 47, wherein the buffer layer includes a layer presenting the interface between the buffer layer and the magnetic structure and made of indium, silver, gold, tin, lead, or alloys thereof.

Example 49 includes the subject matter of Example 47, wherein the buffer layer includes extension regions extending beyond a footprint shape of the inductor structure on the buildup layer adjacent said one of the buildup layers.

Example 50 includes a method of fabricating an inductor structure comprising: depositing, using cold spray, a magnetic structure on a dielectric layer; and providing an electrically conductive body such that one of the magnetic structure or the electrically conductive body wraps around another one of the magnetic structure or the one or more electrically conductive body to form the inductor structure therewith.

Example 51 includes the subject matter of Example 50, wherein at least one of the electrically conductive body or the magnetic structure has a granular microstructure including randomly distributed particles presenting substantially non-linear particle-to-particle boundaries with one another.

Example 52 includes the subject matter of Example 50, wherein: depositing the magnetic structure via cold spray includes depositing a first portion of the magnetic structure on the dielectric layer, and depositing a second portion of the magnetic structure on the conductive body such that the magnetic structure conformally wraps around the electrically conductive body and is adjacent thereto; and providing the electrically conductive body includes using cold spray to deposit the electrically conductive body on the first portion of the magnetic structure.

Example 53 includes the subject matter of Example 50, wherein the electrically conductive body wraps around the magnetic structure.

Example 54 includes the subject matter of Example 51, wherein the particles have sizes ranging from about 10 microns to about 100 microns.

Example 55 includes the subject matter of Example 51, wherein the granular microstructure has a maximum porosity of about 5%.

Example 56 includes the subject matter of Example 50, wherein the magnetic structure does not include an organic component.

Example 57 includes the subject matter of Example 50, wherein the magnetic structure includes one of particles made of a same material or particles including both magnetic particles and non-magnetic particles.

Example 58 includes the subject matter of Example 57, wherein the magnetic material includes one of: particles including iron oxide; particles including chromium dioxide; particles forming a composite including: at least one of particles including aluminum oxide, silicon nitride, or iron nitride; and at least one of particles including iron nickel or samarium cobalt; or particles forming a composite including vanadium ferrite particles and vanadium oxide particles; or particles forming a composite including: at least one of particles including silicon, silicon dioxide, or aluminum oxide; and neodymium particles.

Example 59 includes the subject matter of Example 50, wherein at least one of: the electrically conductive body has a minimum thickness of about 10 microns; or the magnetic structure has a minimum thickness of about 10 microns.

Example 60 includes the subject matter of Example 50, further including, prior to depositing the magnetic structure, providing a buffer layer on the dielectric layer, wherein depositing the magnetic structure includes depositing at least a portion of the magnetic structure on the buffer layer.

Example 61 includes the subject matter of Example 60 wherein the buffer layer includes a layer made of indium, silver, gold, tin, lead, or alloys thereof.

Example 62 includes the subject matter of Example 60, further including patterning the buffer layer such that it, after formation of the inductor structure, the buffer layer has extension regions extending beyond a footprint shape of the inductor structure on the dielectric layer.

Example 63 includes a product made by the process of any one of the methods of Examples 50-62.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

What is claimed is:

1. An inductor structure of a package substrate, the inductor structure including:
   an electrically conductive body;
   a magnetic structure including a non-electrically-conductive magnetic material, wherein:
      one of the magnetic structure or the electrically conductive body wraps around another one of the magnetic structure or the electrically conductive body to form the inductor structure therewith; and
      at least one of the electrically conductive body or the magnetic structure has a granular microstructure including randomly distributed particles presenting substantially non-linear particle-to-particle boundaries with one another; and
   a buffer layer adjacent to the magnetic structure, wherein an interface between the buffer layer and the magnetic structure has a non-flat configuration as compared with an interface between buildup layers of the substrate, wherein some particles of the magnetic structure are at least in part embedded within indentations of the buffer layer.

2. The inductor structure of claim 1, wherein the magnetic structure conformally wraps around the electrically conductive body and is adjacent thereto.

3. The inductor structure of claim 1, wherein the electrically conductive body wraps around the magnetic structure.

4. The inductor structure of claim 1, wherein the particles have sizes ranging from about 10 microns to about 100 microns.

5. The inductor structure of claim 1, wherein the granular microstructure has a maximum porosity of about 5%.

6. The inductor structure of claim 1, wherein the magnetic material does not include an organic component.

7. The inductor structure of claim 1, wherein the magnetic material includes one of particles made of a same material or particles including both magnetic particles and non-magnetic particles.

8. The inductor structure of claim 7, wherein the magnetic material includes one of
   particles including iron oxide;
   particles including chromium dioxide;
   particles forming a composite including:
      at least one of particles including aluminum oxide, silicon nitride, or iron nitride; and
      at least one of particles including iron nickel or samarium cobalt; or
   particles forming a composite including vanadium ferrite particles and vanadium oxide particles; or
   particles forming a composite including:
      at least one of particles including silicon, silicon dioxide, or aluminum oxide; and
      neodymium particles.

9. The inductor structure of claim 1, wherein at least one of:
   the electrically conductive body has a minimum thickness of about 10 microns; or
   the magnetic structure has a minimum thickness of about 10 microns.

10. The inductor structure of claim 1, wherein the buffer layer includes a layer presenting the interface between the buffer layer and the magnetic structure and made of indium, silver, gold, tin, lead, or alloys thereof.

11. The inductor structure of claim 1, wherein the buffer layer includes extension regions extending beyond a footprint shape of the inductor structure on the buildup layer adjacent said one of the buildup layers.

12. A package substrate comprising a plurality of buildup layers, each of the buildup layers including a dielectric material, a power plane, and electrically conductive vias; and an inductor structure in one of the buildup layers, the inductor structure including:
an electrically conductive body;
a magnetic structure including a non-electrically-conductive magnetic material, wherein:
one of the magnetic structure or the electrically conductive body wraps around another one of the magnetic structure or the electrically conductive body to form the inductor structure therewith; and
at least one of the electrically conductive body or the magnetic structure has a granular microstructure including randomly distributed particles presenting substantially non-linear particle-to-particle boundaries with one another; and
a buffer layer adjacent to the magnetic structure, wherein an interface between the buffer layer and the magnetic structure has a non-flat configuration as compared with an interface between buildup layers of the substrate, wherein some particles of the magnetic structure are at least in part embedded within indentations of the buffer layer.

13. The package substrate of claim 12, wherein the magnetic structure conformally wraps around the electrically conductive body and is adjacent thereto.

14. The package substrate of claim 12, wherein the electrically conductive body wraps around the magnetic structure.

15. The package substrate of claim 12, wherein the particles have sizes ranging from about 10 microns to about 100 microns.

16. The package substrate of claim 12, wherein the magnetic material includes one of:
particles including iron oxide;
particles including chromium dioxide;
particles forming a composite including:
at least one of particles including aluminum oxide, silicon nitride, or iron nitride; and
at least one of particles including iron nickel or samarium cobalt; or
particles forming a composite including vanadium ferrite particles and vanadium oxide particles; or
particles forming a composite including:
at least one of particles including silicon, silicon dioxide, or aluminum oxide; and
neodymium particles.

17. An integrated circuit device including:
an integrated circuit component including one or more dies; and
a package substrate including a plurality of buildup layers, the integrated circuit component electrically and mechanically coupled to the package substrate, each of the buildup layers including a dielectric material, a power plane, and electrically conductive vias; and an inductor structure in one of the buildup layers, the inductor structure including:
an electrically conductive body;
a magnetic structure including a non-electrically-conductive magnetic material, wherein:
one of the magnetic structure or the electrically conductive body wraps around another one of the magnetic structure or the electrically conductive body to form the inductor structure therewith; and
at least one of the electrically conductive body or the magnetic structure has a granular microstructure including randomly distributed particles presenting substantially non-linear particle-to-particle boundaries with one another; and
a buffer layer adjacent to the magnetic structure, wherein an interface between the buffer layer and the magnetic structure has a non-flat configuration as compared with an interface between buildup layers of the substrate, wherein some particles of the magnetic structure are at least in part embedded within indentations of the buffer layer.

18. The integrated circuit device of claim 17, wherein the magnetic structure conformally wraps around the electrically conductive body and is adjacent thereto.

19. The integrated circuit device of claim 17, wherein the electrically conductive body wraps around the magnetic structure.

20. An integrated circuit device assembly including:
one or more processing units;
a memory coupled to the one or more processing units; and
an integrated circuit device coupled to the memory and to the one or more processing units, the integrated circuit device including:
an integrated circuit component including one or more dies; and
a package substrate including a plurality of buildup layers, the integrated circuit component electrically and mechanically coupled to the package substrate, each of the buildup layers including a dielectric material, a power plane, and electrically conductive vias; and an inductor structure in one of the buildup layers, the inductor structure including:
an electrically conductive body;
a magnetic structure including a non-electrically-conductive magnetic material, wherein:
one of the magnetic structure or the electrically conductive body wraps around another one of the magnetic structure or the electrically conductive body to form the inductor structure therewith; and
at least one of the electrically conductive body or the magnetic structure has a granular microstructure including randomly distributed particles presenting substantially non-linear particle-to-particle boundaries with one another; and
a buffer layer adjacent to the magnetic structure, wherein an interface between the buffer layer and the magnetic structure has a non-flat configuration as compared with an interface between buildup layers of the substrate, wherein some particles of the magnetic structure are at least in part embedded within indentations of the buffer layer.

21. The integrated circuit device assembly of claim 20, wherein the particles have sizes ranging from about 10 microns to about 100 microns.

* * * * *